United States Patent
Kuno et al.

(10) Patent No.: US 12,266,557 B2
(45) Date of Patent: Apr. 1, 2025

(54) WAFER PLACEMENT TABLE

(71) Applicant: NGK Insulators, Ltd., Nagoya (JP)

(72) Inventors: Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 227 days.

(21) Appl. No.: 17/816,006

(22) Filed: Jul. 29, 2022

(65) Prior Publication Data

US 2023/0154781 A1 May 18, 2023

(30) Foreign Application Priority Data

Nov. 15, 2021 (JP) ................................ 2021-185369
Jul. 5, 2022 (JP) ................................ 2022-108438

(51) Int. Cl.
*H01L 21/00* (2006.01)
*H01J 37/32* (2006.01)
*H01L 21/683* (2006.01)

(52) U.S. Cl.
CPC .... *H01L 21/6833* (2013.01); *H01J 37/32724* (2013.01); *H01J 2237/002* (2013.01); *H01J 2237/2007* (2013.01)

(58) Field of Classification Search
CPC ............ H01L 21/6833; H01J 37/32724; H01J 2237/002; H01J 2237/2007
See application file for complete search history.

(56) References Cited

U.S. PATENT DOCUMENTS

| | | | |
|---|---|---|---|
| 4,973,208 | A | 11/1990 | Gauron |
| 5,783,492 | A | 7/1998 | Higuchi et al. |
| 2006/0279899 | A1 | 12/2006 | Aihara et al. |
| 2009/0283034 | A1 | 11/2009 | Natsuhara et al. |
| 2014/0209245 | A1 | 7/2014 | Yamamoto et al. |
| 2016/0111315 | A1 | 4/2016 | Parkhe |
| 2017/0256431 | A1 | 9/2017 | Parkhe |
| 2017/0323819 | A1* | 11/2017 | Kosakai ............ H01L 21/67103 |
| 2019/0189491 | A1 | 6/2019 | Akatsuka |
| 2021/0225619 | A1* | 7/2021 | Suzuki .................. H01L 21/683 |

(Continued)

FOREIGN PATENT DOCUMENTS

| | | |
|---|---|---|
| JP | 2006344955 A | 12/2006 |
| JP | 2008-066707 A | 3/2008 |
| JP | 2014-150104 A | 8/2014 |

(Continued)

OTHER PUBLICATIONS

Hayashi JP 2019197830 A (Year: 2019).*

(Continued)

*Primary Examiner* — Pete T Lee
(74) *Attorney, Agent, or Firm* — BURR PATENT LAW, PLLC

(57) ABSTRACT

A wafer placement table includes an alumina base that has a wafer placement surface on its upper surface, and incorporates an electrode; a brittle cooling base bonded to a lower surface of the alumina base; and a ductile connection member stored in a storage hole, opened in a lower surface of the cooling base, in a state of restricted axial rotation and in a state of engaging with an engagement section of the storage hole, the ductile connection member having a male thread section or a female thread section.

11 Claims, 13 Drawing Sheets

(56) References Cited

U.S. PATENT DOCUMENTS

2021/0242064 A1* 8/2021 Ito .................. H01J 37/32724

FOREIGN PATENT DOCUMENTS

| | | |
|---|---|---|
| JP | 2019508898 A | 3/2019 |
| JP | 2020074423 A | 5/2020 |
| KR | 10-2019-0032545 A | 3/2019 |

OTHER PUBLICATIONS

Jindo et al. (WO 2014141974 A1) (Year: 2014).*
Korean Office Action (with English translation) dated Mar. 20, 2024 (Application No. 10-2022-0098526).
Japanese Office Action (with English translation), Japanese Application No. 2022-108438, dated Feb. 18, 2025 (13 pages).

* cited by examiner

WAFER PLACEMENT TABLE

BACKGROUND OF THE INVENTION

1. Field of the Invention

The present invention relates to a wafer placement table.

2. Description of the Related Art

Conventionally, a wafer placement table has been known, in which a ceramic base incorporating an electrode, and a cooling base including a refrigerant flow path formed therein are bonded by an adhesive material. PTL 1 describes an example in which such a wafer placement table is placed on an installation plate and fixed by a screw. Specifically, a female thread hole is provided in the lower surface of the cooling base, and a male thread of a bolt is screwed into the female thread hole, the bolt being inserted into a screw insertion hole penetrating the installation plate vertically.

CITATION LIST

Patent Literature

[PTL 1] Japanese Unexamined Patent Application Publication No. 2014-150104

SUMMARY OF THE INVENTION

However, when a female thread hole is provided in the lower surface of the cooling base, and a male thread of a bolt inserted in the installation plate is screwed into the female thread hole, if the material of the cooling base is a ductile material (for instance, aluminum), no problem arises, but if the cooling base is a brittle material (for instance, metal matrix composite material), a problem arises. Specifically, the female thread hole of the cooling base is pulled down locally by a large force acting on the bolt, thus if an inductile material is used for the cooling base, it may be broken.

The present invention has been made to solve such a problem, and it is a main object to make it possible to tighten the wafer placement table including a brittle cooling base to the installation plate without any problem.

[1] A wafer placement table of the present invention includes: an alumina base that has a wafer placement surface on its upper surface, and incorporates an electrode; a brittle cooling base bonded to a lower surface of the alumina base; and a ductile connection member stored in a storage hole, opened in a lower surface of the cooling base, in a state of restricted axial rotation and in a state of engaging with an engagement section of the storage hole, the ductile connection member having a male thread section or a female thread section.

In the wafer placement table, the connection member having the male thread section or the female thread section is stored in the storage hole, opened in the lower surface of the cooling base, in a state of restricted axial rotation and in a state of engaging with the engagement section of the storage hole. Since axial rotation of the connection member is restricted, it can be screwed to a to-be-connected member having the male thread section or the female thread section disposed on the lower surface side of the cooling base. In addition, even when the connection member in a state of engaging with the engagement section of the storage hole is pulled toward the installation plate by the to-be-connected member provided in the installation plate, the connection member is unlikely to break because it has ductility. Therefore, it is possible to tighten the wafer placement table including a brittle cooling base to the installation plate without any problem.

Note that in the present specification, the present invention may be described using up and down, right and left, and front and back; however up and down, right and left, and front and back merely indicate a relative positional relationship. Thus, when the orientation of the wafer placement table is changed, up and down may change to right and left, or right and left may change to up and down, and such a case is also included in the technical scope of the present invention.

[2] In the above-described wafer placement table (the wafer placement table according to [1]), the connection member may be a member having the female thread section, and being screwable to a male thread of a bolt inserted from a lower surface side of the cooling base.

[3] In the above-described wafer placement table (the wafer placement table according to [1] or [2]), the cooling base may be composed of a composite material of metal and ceramic or an alumina material. Because a composite material of metal and ceramic and an alumina material are brittle materials, application of the present invention has high significance. For instance, when a composite material of metal and ceramic is used, it is preferable that a composite material having the same thermal expansion coefficient as alumina be used.

[4] In the above-described wafer placement table (the wafer placement table according to any one of [1] to [3]), the engagement section may be a step section or an inclined section provided in an inner circumferential surface of the storage hole, and the connection member may have a to-be-engaged section which engages with the engagement section to prevent the connection member from falling from the storage hole. In this manner, the engagement section and the to-be-engaged section can be produced relatively easily. For instance, when the engagement section is a step section, the connection member may be provided with a to-be-engaged section which hooks to the step section. When the engagement section is an inclined section, the connection member may be provided with an inclined face as the to-be-engaged section, the inclined face conforming to the inclined section.

[5] In the above-described wafer placement table (the wafer placement table according to any one of [1] to [4]), when being attempted to be axially rotated, the connection member may come into contact with a wall of the storage hole to undergo restricted axial rotation. In this manner, axial rotation of the connection member can be restricted by a relatively simple configuration.

[6] In the above-described wafer placement table (the wafer placement table according to any one of [1] to [5]), the cooling base may have a refrigerant flow path internally, and the storage hole may be provided in a region of the cooling base, the region being lower than the bottom surface of the refrigerant flow path. In this manner, the storage hole does not interfere with the refrigerant flow path, thus the degree of freedom of the design of the refrigerant flow path is not reduced.

[7] In the above-described wafer placement table (the wafer placement table according to any one of [1] to [6]), the connection member may not be connected to the cooling base in the storage hole, and may be stored in a free state. In this manner, the connection member only has to be inserted in the storage hole, which does not take much effort.

[8] In the above-described wafer placement table (the wafer placement table according to any one of [1] to [7]), the connection member may engage with the engagement section with a stress buffering member interposed between the connection member and the engagement section, the stress buffering member having a lower Young's modulus lower than the connection member. In this manner, even when the connection member is pulled toward the installation plate by a to-be-connected member provided in the installation plate, the stress tends to be dispersed because the stress buffering member is interposed between the connection member and the engagement section.

[9] In the above-described wafer placement table (the wafer placement table according to any one of [1] to [8]), the gap between the connection member and the storage hole may be filled with a filling material. In this manner, thermal conduction becomes favorable as compared to when the gap between the connection member and the storage hole is void. Therefore, the thermal uniformity of the wafer improves.

[10] In the above-described wafer placement table (the wafer placement table according to any one of [1] to [9]), the storage hole may include a first storage section that stores the connection member, and a second storage section provided from the first storage section to the lower surface of the cooling base. The engagement section may be a stepped surface provided at a joint between the first storage section and the second storage section.

[11] In the above-described wafer placement table (the wafer placement table according to [10]), the first storage section may be opened in an upper surface of the cooling base, and an opening surface may be covered by a bonding layer that bonds the ceramic base and the cooling base. In this manner, the first storage section can be produced relatively easily as compared to when the first storage section is incorporated in the inside of the cooling base. In this structure, a refrigerant flow path (or a refrigerant flow path groove) needs to be provided skirting the storage hole, thus the thermal uniformity is likely to reduce in the vicinity immediately above the storage hole of the wafer. In order to prevent the reduction in the thermal uniformity, the gap between the connection member and the storage hole is preferably filled with a filling material. Consequently, the thermal conduction around the storage hole is favorable, thus reduction in the thermal uniformity can be prevented.

[12] In the above-described wafer placement table (the wafer placement table according to [10] or [11]), the width of an annular region in which the stepped surface is in direct or indirect contact with the connection member is preferably 3 mm or more. In this manner, with the width of the annular region of 3 mm or more, even when the connection member is pulled toward the installation plate by the to-be-connected member provided in the installation plate, the stress tends to be dispersed because the annular region in which the stepped surface is in direct or indirect contact with the connection member is large.

DETAILED DESCRIPTION OF THE INVENTION

First Embodiment

Figure 1:
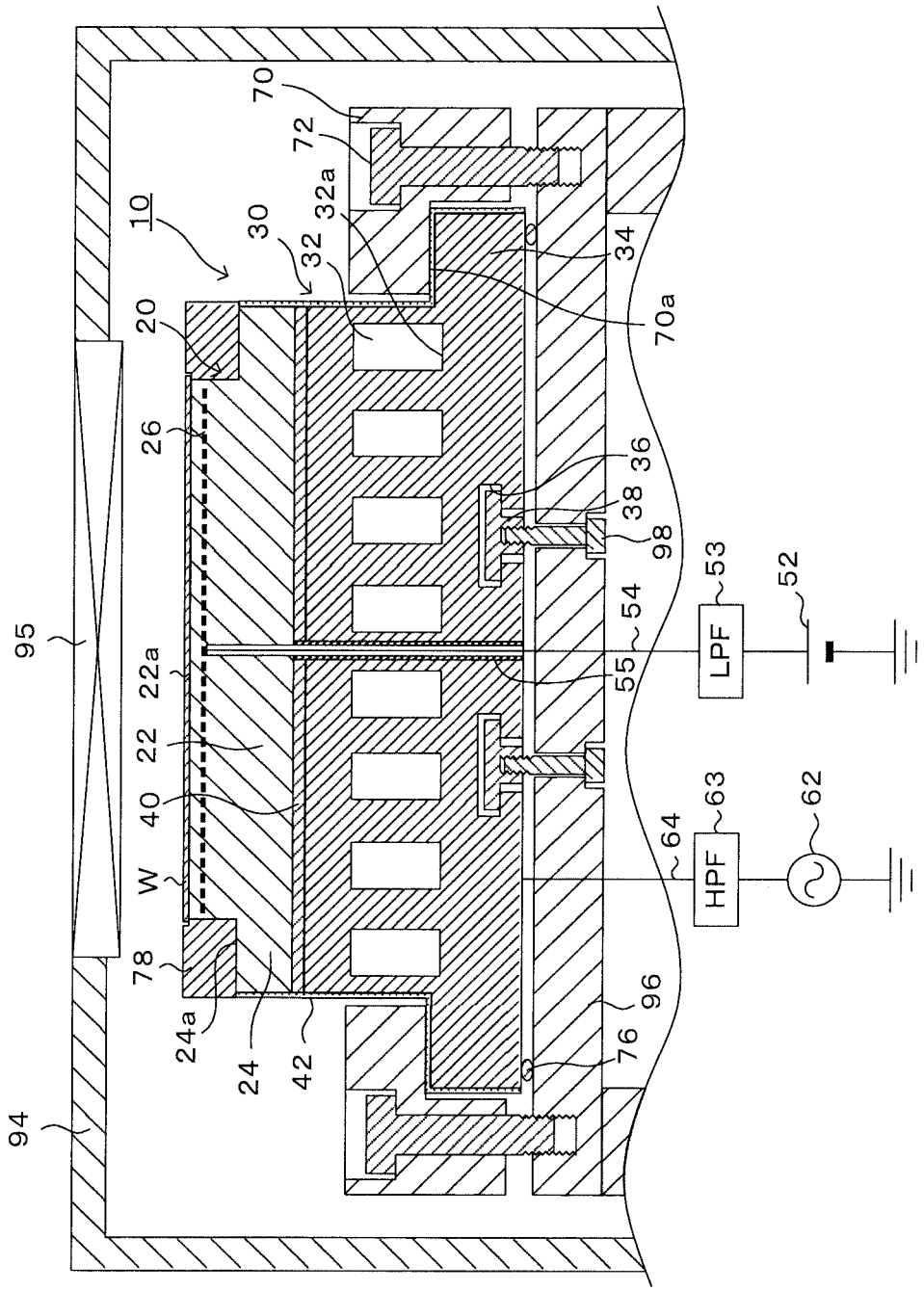
FIG. 1 is a vertical cross-sectional view of a wafer placement table 10 installed in a chamber 94.
Figure 2:
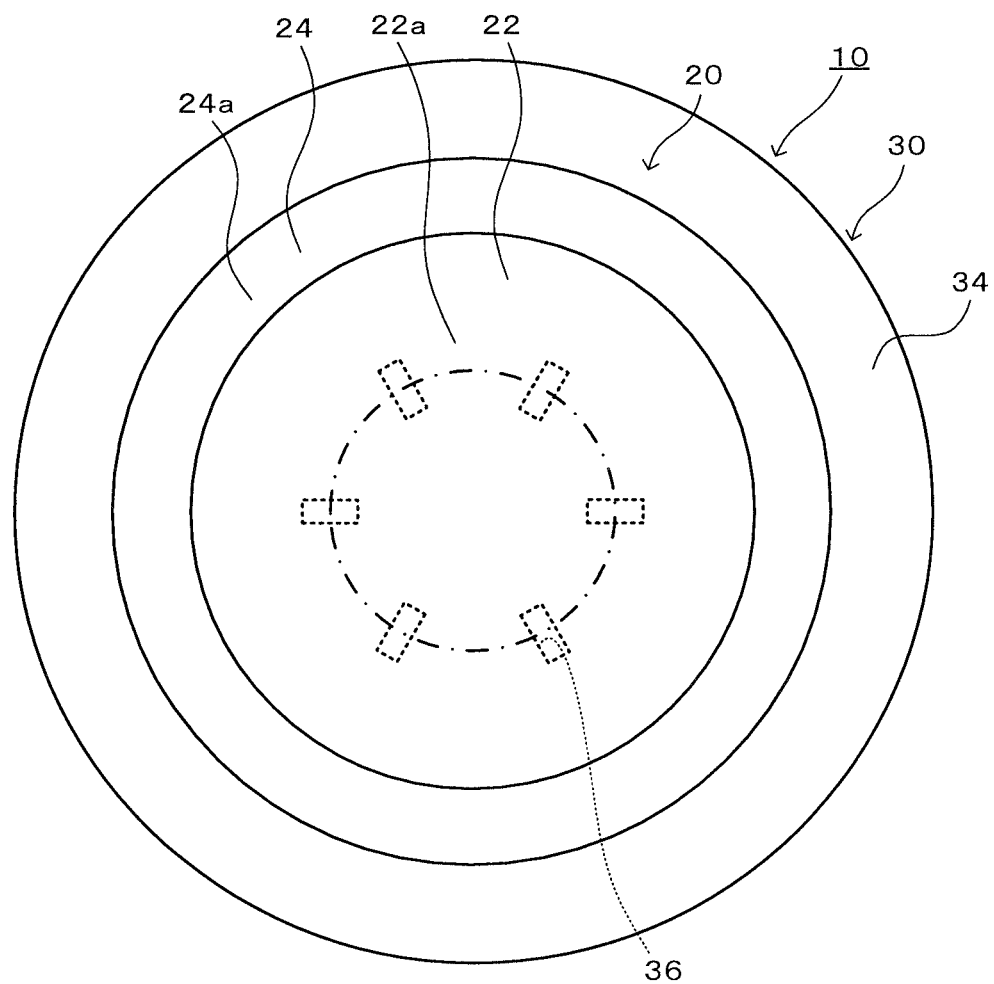
FIG. 2 is a plan view of the wafer placement table 10.
Figure 3:
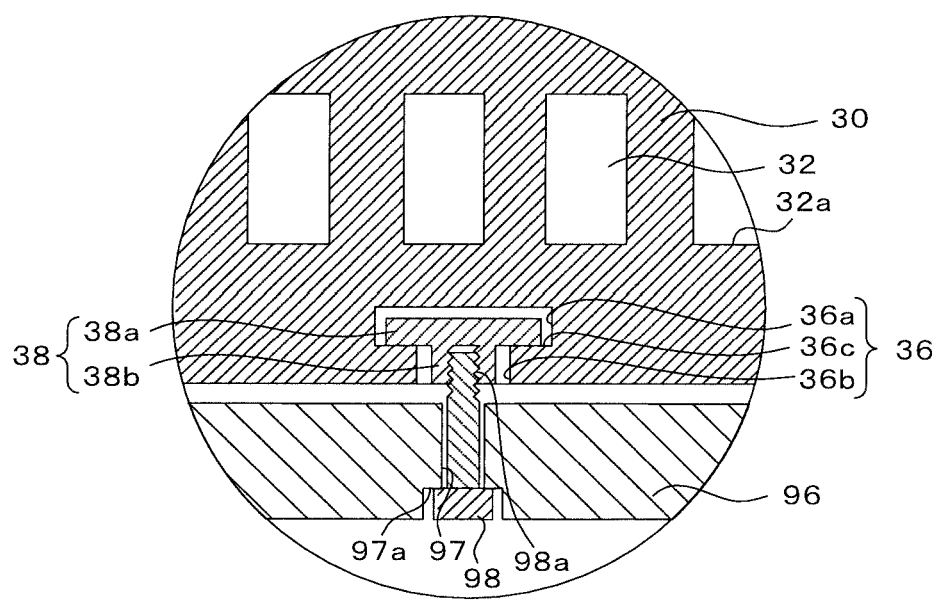
FIG. 3 is an enlarged cross-sectional view illustrating the vicinity of a storage hole 36 and a female thread member 38.
Figure 4:
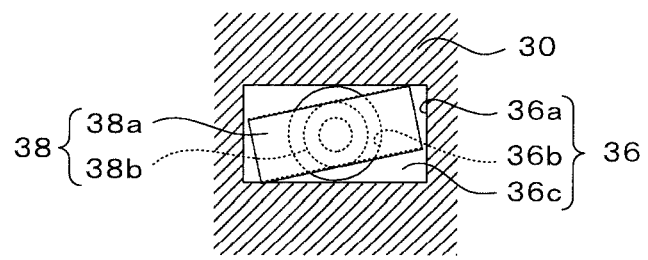
FIG. 4 is a cross-sectional view of the cooling base 30 as seen from above when it is cut horizontally along the ceiling surface of the storage hole 36.

A preferred embodiment of the present invention will be described below with reference to the drawings. FIG. 1 is a vertical cross-sectional view (cross-sectional view when the wafer placement table 10 is cut along a plane including the central axis thereof) of a wafer placement table 10 installed in a chamber 94, FIG. 2 is a plan view of the wafer placement table 10, FIG. 3 is an enlarged cross-sectional view illustrating the vicinity of a storage hole 36 and a female thread member 38, and FIG. 4 is a cross-sectional view of a cooling base 30 as seen from above when it is cut horizontally along the ceiling surface of the storage hole 36.

The wafer placement table 10 is used for performing CVD and etching on wafer W utilizing plasma, and is fixed to an installation plate 96 provided inside the chamber 94 for semiconductor process. The wafer placement table 10 includes an alumina base 20, a cooling base 30, and a metal bonding layer 40.

The alumina base 20 includes an outer circumferential section 24 having an annular focus ring placement surface 24a, on an outer circumference of a central section 22 having a circular wafer placement surface 22a. Hereinafter focus ring may be abbreviated as "FR". The wafer W is placed on the wafer placement surface 22a, and a focus ring 78 is placed on the FR placement surface 24a. The FR placement surface 24a is lower by one step than the wafer placement surface 22a.

The central section 22 of the alumina base 20 incorporates a wafer attracting electrode 26 at a position near the wafer placement surface 22a. The wafer attracting electrode 26 is composed of a material containing, for instance, W, Mo, WC, MoC. The wafer attracting electrode 26 is a circular plate-shaped or mesh-shaped monopole electrostatic attraction electrode. Of the alumina base 20, an upper layer over the wafer attracting electrode 26 functions as a dielectric layer. The wafer attracting electrode 26 is coupled to a wafer attracting DC power supply 52 via a power feed terminal 54. The power feed terminal 54 is provided to reach the wafer attracting electrode 26 from the lower surface of the alumina base 20 through an insulated tube 55 disposed in a through-hole vertically penetrating the cooling base 30 and the metal bonding layer 40. A low pass filter (LPF) 53 is provided between the wafer attracting DC power supply 52 and the wafer attracting electrode 26.

The cooling base 30 is a disc member. A composite material of metal and ceramic is preferably used as the material for the cooling base 30. As such a composite material, a metal matrix composite material (also referred to as a metal matrix composite (MMC)) and a ceramic matrix composite material (also referred to as a ceramic matrix composite (CMC)) may be mentioned. These composite materials are a kind of a brittle material. The cooling base 30 internally includes a refrigerant flow path 32 in which a refrigerant can circulate. The refrigerant flow path 32 is connected to a refrigerant supply path and a refrigerant discharge path which are not illustrated, and the refrigerant discharged through the refrigerant discharge path undergoes temperature control, then is returned to the refrigerant supply path again. The refrigerant flowing through the refrigerant flow path 32 is preferably liquid, and preferably has an electrical insulation property. As the liquid having an electrical insulation property, for instance, fluorine-based inert liquid may be mentioned. As the composite material of metal and ceramic, a material containing Si, SiC and Ti, a material obtained by impregnating SiC porous body with Al and/or Si, and a composite material of $Al_2O_3$ and TiC may be mentioned. A material containing Si, SiC and Ti is called SiSiCTi, a material obtained by impregnating SiC porous body with Al is called AlSiC, and a material obtained by impregnating SiC porous body with Si is called SiSiC. As the composite material used for the cooling base 30, AlSiC and SiSiCTi having a thermal expansion coefficient closer to that of alumina are preferable. The cooling base 30 is coupled to an RF power supply 62 via a power feed terminal 64. A high pass filter (HPF) 63 is disposed between the cooling base 30 and the RF power supply 62. The cooling base 30 has a flange 34, near its lower surface, which is used to clamp the wafer placement table 10 to the installation plate 96.

The cooling base 30 is provided with a plurality of storage holes 36, in each of which a female thread member 38 (connection member) is stored. The plurality of storage holes 36 are provided in a region of the cooling base 30, the region being lower than a bottom surface 32a of the refrigerant flow path 32. The plurality of storage holes 36 are plurally provided at regular intervals (for instance, six or eight) along a concentric circle (for instance, a circle with a diameter equal to ½ or ⅓ the diameter of the wafer W) of the cooling base 30. In other words, as illustrated in FIG. 2, the plurality of storage holes 36 are provided in a region near the center of the wafer placement table 10. As illustrated in FIG. 3, the storage holes 36 are opened in the lower surface of the cooling base 30. Each storage hole 36 includes a first storage section 36a, a second storage section 36b, and a step section 36c. The first storage section 36a is a cuboid-shaped space provided at an upper portion of the storage hole 36. The second storage section 36b is a cylindrical space provided at a lower portion of the storage hole 36. The step section 36c is a joint part between the first storage section 36a and the second storage section 36b. The storage hole 36 stores a female thread member 38. The female thread member 38 has a cuboid-shaped head 38a, and a cylindrical section 38b provided in the lower surface of the head 38a, and a thread is formed on the inner circumferential surface of the cylindrical section 38b. The head 38a of the female thread member 38 is stored in the first storage section 36a of the storage hole 36. Since the lower surface of the head 38a engages with the step section 36c of the storage hole 36, the female thread member 38 does not fall from the storage hole 36. The cylindrical section 38b of the female thread member 38 is stored in the second storage section 36b of the storage hole 36. As illustrated in FIG. 4, when the female thread member 38 is attempted to be axially rotated, the head 38a comes into contact with the side walls of the first storage section 36a to undergo restricted axial rotation. The female thread member 38 is composed of a ductile material (for instance, Ti, Mo, W).

The metal bonding layer 40 bonds the lower surface of the alumina base 20 and the upper surface of the cooling base 30. The metal bonding layer 40 may be a layer composed of a solder or a metal brazing material, for instance. The metal bonding layer 40 is formed by TCB (Thermal compression bonding), for instance. TCB is a publicly known method, in which a metal bonding material is inserted between two members to be bonded, and the two members are pressure-bonded in a state of heated to a temperature lower than or equal to the solidus temperature of the metal bonding material.

The side surface of the outer circumferential section 24 of the alumina base 20, the outer circumference of the metal bonding layer 40 and the side surface of the cooling base 30 are covered with an insulating film 42. As the insulating film 42, for instance, a thermal spray film such as alumina and yttria may be mentioned.

The wafer placement table 10 is mounted on the installation plate 96 provided inside the chamber 94 with a seal ring 76 interposed between the wafer placement table 10 and the installation plate 96. The seal ring 76 is made of metal or resin, and its outer diameter is slightly smaller than the outer diameter of the cooling base 30. The outer circumferential area of the wafer placement table 10 is attached to the installation plate 96 using a clamping member 70. The clamping member 70 is an annular member with a substantially inverted L-shaped cross section, and has an inner circumferential stepped surface 70a. With the inner circumferential stepped surface 70a of the clamping member 70 placed on the flange 34 of the cooling base 30 of the wafer placement table 10, bolts 72 are each inserted through the upper surface of the clamping member 70 and screwed into a screw hole provided on the upper surface of the installation plate 96. The bolts 72 are attached to multiple sites (for instance, eight sites or 12 sites) provided at regular intervals in the circumferential direction of the clamping member 70. The clamping member 70 and the bolts 72 may be produced with an insulating material, or produced with a conductive material (such as metal). In addition, the central area of the wafer placement table 10 is attached to the installation plate 96 using bolts 98 (to-be-connected members). As illustrated in FIG. 3, the foot of each bolt 98 is provided with a male thread 98a. The bolt 98 is inserted into a through-hole 97 provided at the position, opposed to the storage hole 36, of the installation plate 96 through the lower surface of the installation plate 96, and the male thread 98a is screwed into the female thread member 38 in the storage hole 36. The through-hole 97 has a smaller diameter in the upper section and a larger diameter in the lower section, and has a step section 97a between the upper section and the lower section. The head of the bolt 98 hooks to the step section 97a of the through-hole 97. Since the female thread member 38 is stored in the first storage section 36a of the storage hole 36 in a state of restricted axial rotation, the bolt 98 can be screwed into the female thread member 38. When the bolt 98 is screwed into the female thread member 38, the female thread member 38 is set in a state of being pulled toward the installation plate 96 with the head 38a engaging with the step section 36c of the storage hole 36.

At the time of use of the wafer placement table 10, the wafer placement surface 22a side of the alumina base 20 turns to vacuum, the lower surface side of the cooling base 30 turns to atmosphere, thus the wafer placement table 10 tends to project upward. When the wafer W is treated with a high-power plasma, the wafer placement surface 22a side of the alumina base 20 has a high temperature, and the lower surface side has a low temperature, thus the wafer placement surface 22a side tends to extend, and the wafer placement table 10 tends to project upward. However, in the embodiment, the central area of the wafer placement table 10 is fixed by the bolts 98, thus, it is possible to prevent the wafer placement table 10 from projecting upward. Even if a seal ring, which is not illustrated, is disposed between the central area of the lower surface of the cooling base 30 and the upper surface of the installation plate 96, since the central area of the wafer placement table 10 is fixed by the bolts 98, the seal ring is maintained in a firmly crushed state.

Figure 5:
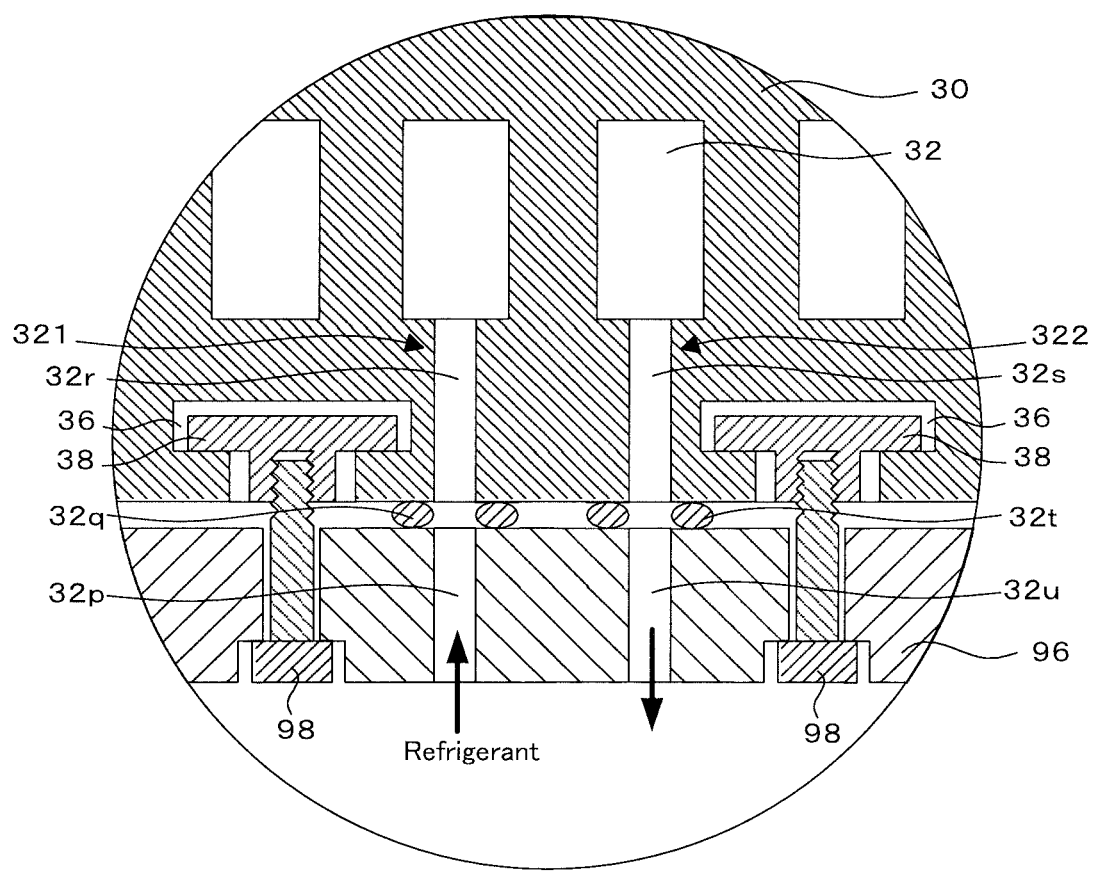
FIG. 5 is an enlarged cross-sectional view illustrating a refrigerant supply path 321 and a refrigerant discharge path 322.

For instance, as illustrated in FIG. 5, the refrigerant supply path 321 is formed by a first supply path 32p penetrating the installation plate 96, the inside of a refrigerant supply seal ring 32q disposed between the installation plate 96 and the cooling base 30, and a second supply path 32r from the lower surface of the cooling base 30 to the refrigerant flow path 32. The refrigerant discharge path 322 is formed by a first discharge path 32s from the refrigerant flow path 32 to the lower surface of the cooling base 30, the inside of a refrigerant discharge seal ring 32t disposed between the cooling base 30 and the installation plate 96, and a second discharge path 32u which penetrates the installation plate 96 and reaches the lower surface of the installation plate 96. In this case, the central area of the wafer placement table 10 is fixed by screwing the female thread member 38 in the storage hole 36 and the bolt 98 together, thus these seal rings 32q, 32t are maintained in a firmly crushed state. Thus, the seal rings 32q, 32t can secure the sealing property sufficiently.

Figure 6:
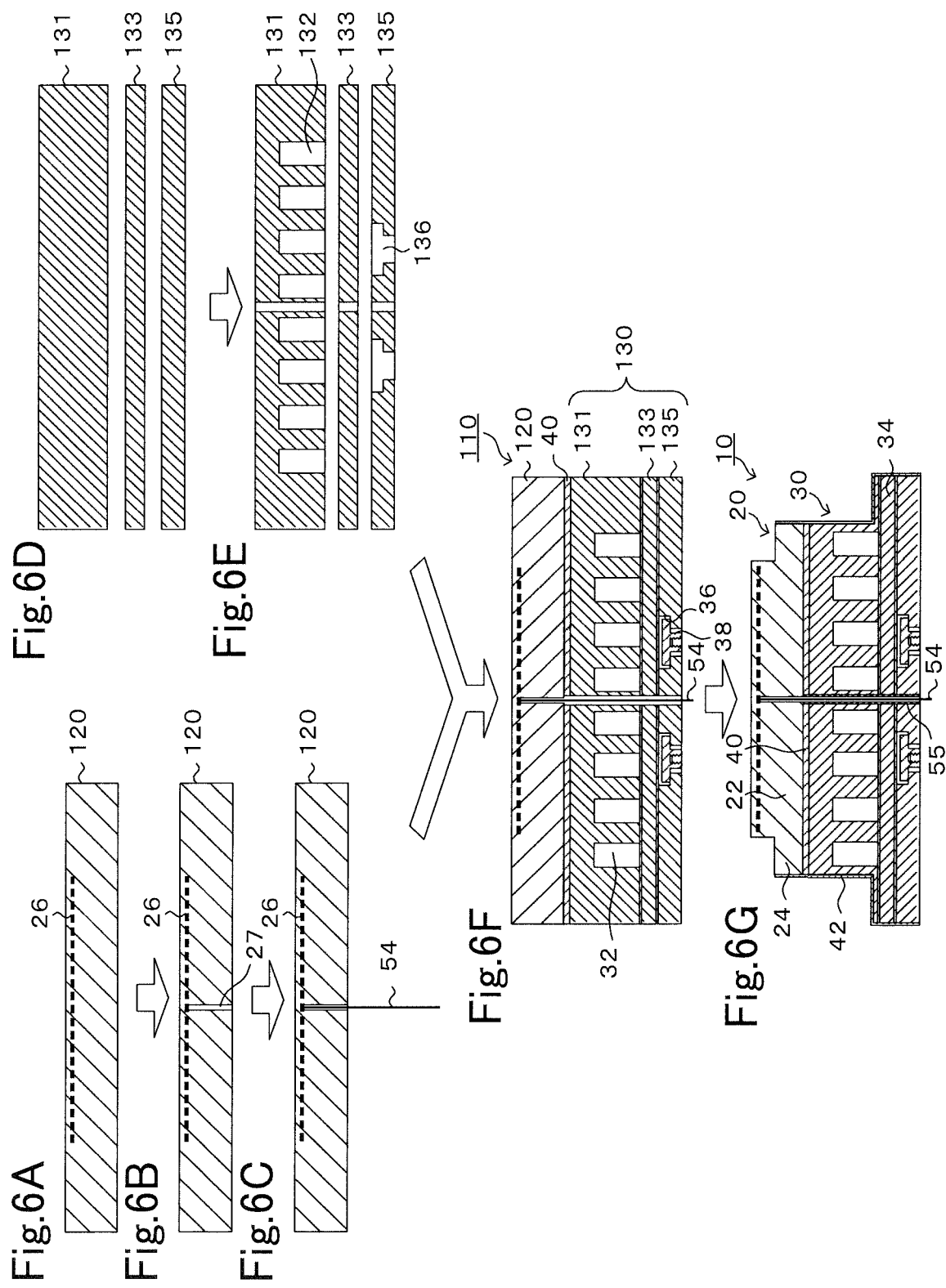
FIGS. 6A to 6G are manufacturing process charts of the wafer placement table 10.

Next, a manufacturing example of the wafer placement table 10 will be described using FIGS. 6A to 6G. FIGS. 6A to 6G are manufacturing process charts of the wafer placement table 10. First, a disc-shaped alumina sintered body 120, from which the alumina base 20 is made, is produced by hot-press firing a molded body of alumina powder (FIG. 6A). The alumina sintered body 120 incorporates the wafer attracting electrode 26. Next, a hole 27 is formed from the lower surface of the alumina sintered body 120 to the wafer attracting electrode 26 (FIG. 6B), and the power feed terminal 54 is inserted into the hole 27 to join the power feed terminal 54 to the wafer attracting electrode 26 (FIG. 6C).

Concurrently, three MMC disc members 131, 133, 135 are produced (FIG. 6D). Then a groove 132, which eventually serves as the refrigerant flow path 32, is formed in the lower surface of the upper MMC disc member 131, a step hole 136, which eventually serves as the storage hole 36, is formed in the lower MMC disc member 135, and additionally, a through-hole vertically penetrating the three MMC disc members 131, 133, 135 is formed (FIG. 6E). These through-holes eventually serve as holes for inserting the power feed terminal 54. When the alumina sintered body 120 is made of alumina, the MMC disc members 131, 133, 135 are preferably made of SiSiCTi or AlSiC. This is because the thermal expansion coefficient of alumina is approximately the same as the thermal expansion coefficients of SiSiCTi and AlSiC.

A disc member made of SiSiCTi can be produced as follows, for instance. First, silicon carbide, metal Si and metal Ti are mixed to produce a powder mixture. Next, a disc-shaped molded body is produced by applying uniaxial pressure molding to the obtained powder mixture, and hot-press sintering is applied to the molded body in an inert atmosphere to obtain a disc member made of SiSiCTi.

Next, the female thread member 38 is stored in the step hole 136 of the lower MMC disc member 135. Then a metal bonding material is disposed between the lower surface of the upper MMC disc member 131 and the upper surface of the middle MMC disc member 133, a metal bonding material is disposed between the lower surface of the middle MMC disc member 133 and the upper surface of the lower MMC disc member 135, and a metal bonding material is further disposed on the upper surface of the upper MMC disc member 131. Each metal bonding material is provided with a through-hole at position for inserting the power feed terminal 54. Next, the power feed terminal 54 of the alumina sintered body 120 is inserted into the through-holes of the MMC disc members 131, 133, 135, and the alumina sintered body 120 is placed on the metal bonding material disposed on the upper surface of the upper MMC disc member 131. Thus, a laminated body is obtained, in which the MMC disc member 135, a metal bonding material, the MMC disc member 133, a metal bonding material, the MMC disc member 131, a metal bonding material and the alumina sintered body 120 are laminated in that order from the bottom. A bonded body 110 is obtained (FIG. 6F) by pressurizing the laminated body while heating it (TCB). The bonded body 110 is such that the alumina sintered body 120 is bonded onto the upper surface of the MMC block 130, from which the cooling base 30 is produced, with the metal bonding layer 40 interposed between the alumina sintered body 120 and the MMC block 130. The MMC block 130 is such that the upper MMC disc member 131 and the middle MMC disc member 133 are bonded with a metal bonding layer interposed therebetween, and the middle MMC disc member 133 and the lower MMC disc member 135 are bonded with a metal bonding layer interposed therebetween. The MMC block 130 has the refrigerant flow path 32 and the storage holes 36 internally. In addition, a female thread member 38 is stored in each storage hole 36.

TCB is performed as follows, for instance. Specifically, a laminated body is pressurized and bonded at a temperature (for instance, the solidus temperature minus 20° C. or higher and the solidus temperature or lower) lower than or equal to the solidus temperature of the metal bonding material, and subsequently, the temperature is returned to the room temperature. Consequently, the metal bonding material becomes a metal bonding layer. Then an Al—Mg based bonding material and an Al—Si—Mg based bonding material can be used as the metal bonding material. For instance, when TCB is performed using the Al—Si—Mg based bonding material, the laminated body is pressurized in a state of heated in a vacuum atmosphere. A metal bonding material with a thickness of approximately 100 μm is preferably used.

Subsequently, the outer circumference of the alumina sintered body 120 is cut to form a step, thus the alumina base 20 including the central section 22 and the outer circumferential section 24 is produced. Also, the outer circumference of the MMC block 130 is cut to form a step, thus the cooling base 30 including the flange 34 is produced. In addition, the insulated tube 55 is disposed in the insertion hole of the power feed terminal 54 provided in the MMC block 130 and the metal bonding layer 40. Furthermore, the insulating film 42 is formed by applying thermal spraying using alumina powder to the side surface of the outer circumferential section 24 of the alumina base 20, the periphery of the metal bonding layer 40 and the side surface of the cooling base 30 (FIG. 6G). Consequently, the wafer placement table 10 is obtained.

Although the cooling base 30 of FIG. 1 has been described as an integrated component, a structure may be adopted, in which three members are bonded by metal bonding layers, or a structure may be adopted, in which two or four or more members are bonded by metal bonding layers as illustrated in FIG. 6O.

Next, an example of use of the wafer placement table 10 will be described using FIG. 1. As described above, on the installation plate 96 of the chamber 94, the outer circumferential area of the wafer placement table 10 is fixed by the clamping member 70, and the central area of the wafer placement table 10 is fixed by the bolts 98. On the ceiling surface of the chamber 94, a shower head 95 is disposed which injects a process gas through a large number of gas injection holes to the inside of the chamber 94. The installation plate 96 is composed of an insulating material such as alumina, for instance.

The focus ring 78 is placed on the FR placement surface 24a of the wafer placement table 10, and a disc-shaped wafer W is placed on the wafer placement surface 22a. The focus ring 78 includes a step along the inner circumference of the upper end so as not to interfere with the wafer W. In this state, the DC voltage of the wafer attracting DC power supply 52 is applied to the wafer attracting electrode 26 to cause the wafer placement surface 22a to attract the wafer W. The inside of the chamber 94 is set to have a predetermined vacuum atmosphere (or a reduced pressure atmosphere), and an RF voltage from the RF power supply 62 is applied to the cooling base 30 while supplying a process gas from the shower head 95. Then a plasma is generated between the wafer W and the shower head 95. The plasma is utilized to perform CVD film formation and etching on the wafer W. Although the focus ring 78 is also worn out along with plasma treatment of the wafer W, the focus ring 78 is thicker than the wafer W, thus the focus ring 78 is replaced after several wafers W are treated.

When the wafer W is treated with a high-power plasma, it is necessary to cool the wafer W efficiently. In the wafer placement table 10, as the bonding layer between the alumina base 20 and the cooling base 30, the metal bonding layer 40 having a high thermal conductivity is used rather than a resin layer having a low thermal conductivity. Thus, the capacity (heat removal capacity) to remove heat from the wafer W is high. In addition, the thermal expansion difference between the alumina base 20 and the cooling base 30 is small, thus even when the stress relaxation performance of the metal bonding layer 40 is low, a problem is unlikely to occur.

In the wafer placement table 10 described above, each female thread member 38 is stored in a storage hole 36, opened in the lower surface of the cooling base 30, in a state of restricted axial rotation and in a state of engaging with the step section 36c (engagement section) of the storage hole 36 so as not to fall from the storage hole 36. Since axial rotation of the female thread member 38 is restricted, the male thread 98a of the bolt 98 inserted from the lower surface side of the cooling base 30 can be screwed into the female thread member 38. In addition, even when the female thread member 38 in a state of engaging with the step section 36c of the storage hole 36 is pulled toward the installation plate 96 by the bolt 98 inserted in the installation plate 96, the female thread member 38 is unlikely to break because it has ductility. Consequently, it is possible to tighten the wafer placement table 10 including the brittle cooling base 30 to the installation plate 96 without a problem.

The cooling base 30 is composed of the MMC. Because the MMC is a brittle material, application of the present invention has high significance.

Furthermore, the storage hole 36 includes the step section 36c as an engagement section, and the female thread member 38 includes the head 38a as a to-be-engaged section. Thus, the engagement section and the to-be-engaged section can be produced relatively easily.

In addition, when the female thread member 38 is attempted to be axially rotated, it comes into contact with the side walls of the first storage section 36a of the storage hole 36 to undergo restricted axial rotation. Thus, axial rotation of the female thread member 38 can be restricted by a relatively simple configuration.

The storage hole 36 is provided in a region of the cooling base 30, the region being lower than the bottom surface 32a of the refrigerant flow path 32. Thus, the storage hole 36 does not interfere with the refrigerant flow path 32. Therefore, the degree of freedom of the design of the refrigerant flow path 32 is not reduced.

In addition, the female thread member 38 is not connected to the cooling base 30 in the storage hole 36, and is stored in a free state. When the wafer placement table 10 is produced, the female thread member 38 only has to be inserted in the storage hole 36, which does not take much effort.

Note that the present invention is not limited to the above-described embodiment, and may be, of course, implemented in various modes within the technical scope of the present invention.

Figure 7:
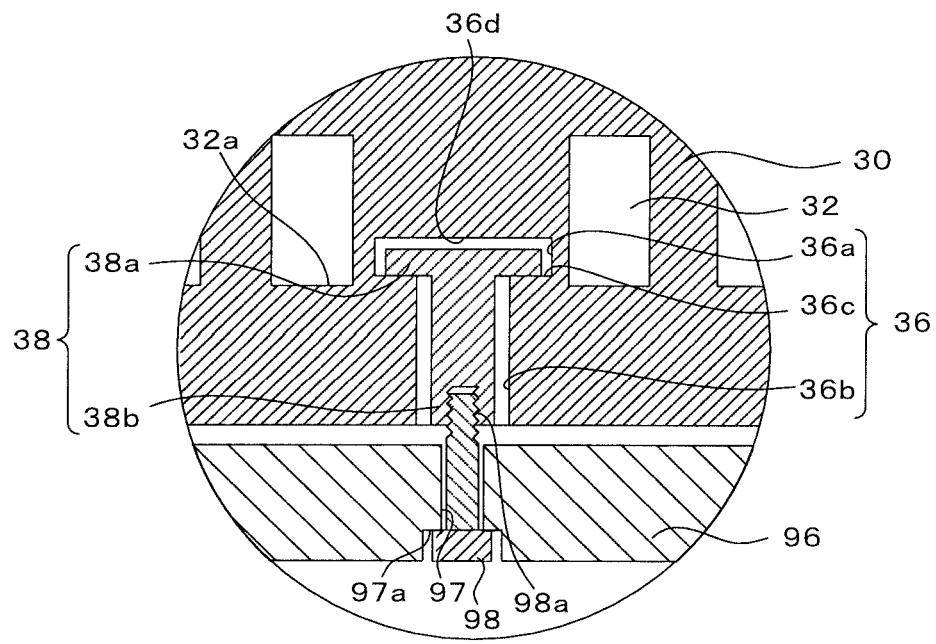
FIG. 7 is an enlarged cross-sectional view illustrating another example of the storage hole 36 and the female thread member 38.

In the first embodiment described above, each storage holes 36 is provided in a region of the cooling base 30, the region being lower than the bottom surface 32a of the refrigerant flow path 32; however, the present invention is not limited to this. For instance, as illustrated in FIG. 7, a ceiling surface 36d of the storage hole 36 may be provided so as to be higher than the bottom surface 32a of the refrigerant flow path 32. In FIG. 7, the same components as in the above-described first embodiment are labeled with the same symbols. In FIG. 7, the first storage section 36a of the storage hole 36 has the same size as in the above-described first embodiment; however, the vertical length of the second storage section 36b is longer than in the above-described first embodiment. The head 38a of the female thread member 38 has the same size as in the above-described first embodiment; however, the vertical length of the cylindrical section 38b is longer than in the above-described first embodiment. Also in this manner, substantially the same effects as in the above-described first embodiment are obtained. However, the degree of freedom of the design of the refrigerant flow path 32 is limited as compared to the above-described first embodiment.

Figure 8:
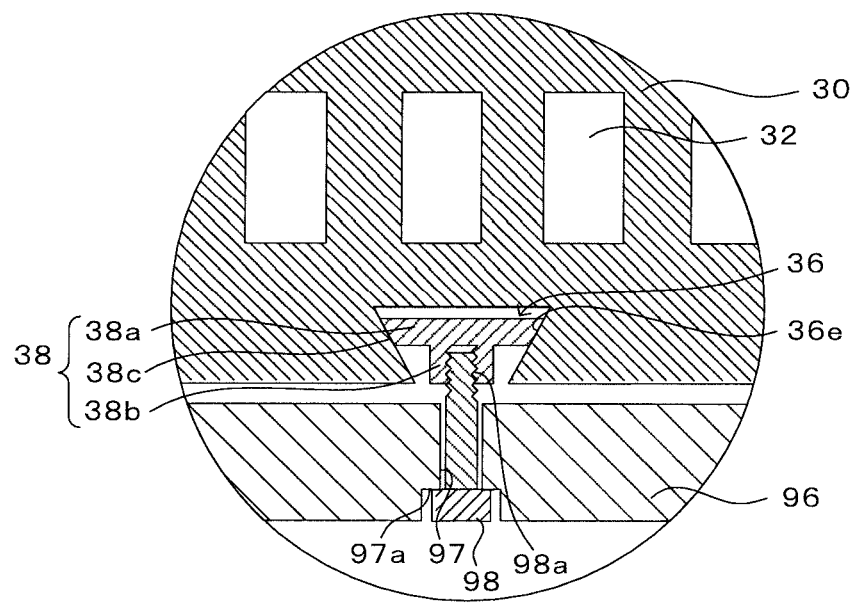
FIG. 8 is an enlarged cross-sectional view illustrating another example of the storage hole 36 and the female thread member 38.

In the above-described first embodiment, the inner circumferential surface of the storage hole 36 is provided with the step section 36c; however, the present invention is not limited to this. For instance, as illustrated in FIG. 8, let inclined faces 38c be opposed side faces of the head 38a of the female thread member 38, and the inner peripheral surface of the storage hole 36 may be provided with inclined sections 36e which conform to the inclined faces 38c. In this case, the inclined faces 38c of the female thread member 38 engage with the inclined sections 36e of the storage hole 36, thus the female thread member 38 does not fall from the storage hole 36. When the bolt 98 is screwed into the female thread member 38, the female thread member 38 is set in a state of being pulled toward the installation plate 96 with the inclined faces 38c engaging with the inclined sections 36e of the storage hole 36.

In the above-described first embodiment, the shape of the head 38a of the female thread member 38 is rectangular in a plan view; however, the present invention is not particularly limited to this. For instance, the shape of the head 38a may be a polygonal shape, such as a triangular shape and a pentagonal shape, or may be a plus (+) shape or an elliptic shape. The shape of the first storage section 36a of the storage hole 36 should be such that attempt to axially rotate the female thread member 38 causes the head 38a to collide with the side walls. This point also applies to a female thread member 538 in the second embodiment described below.

Figure 9:
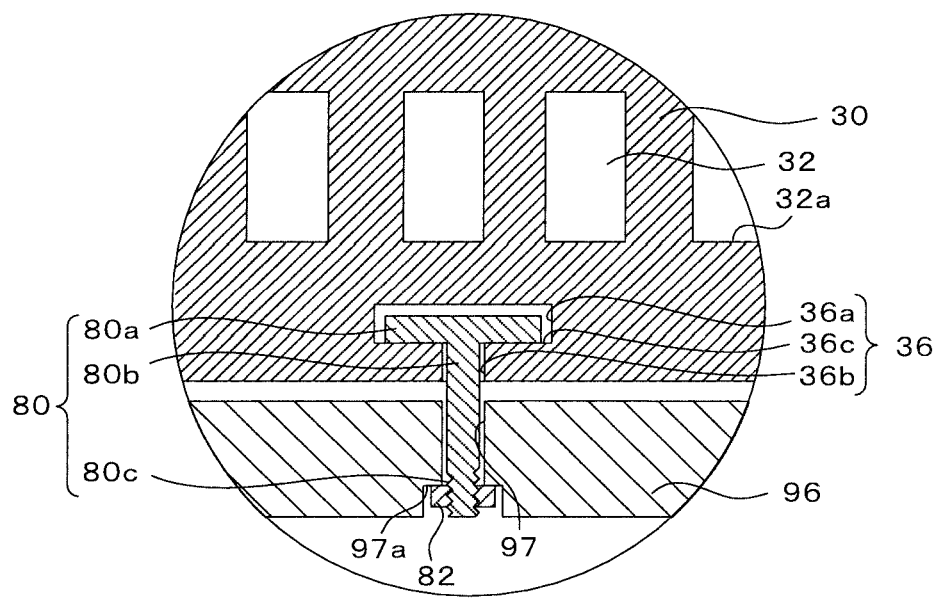
FIG. 9 is an enlarged cross-sectional view when a male thread member 80 is used as a connection member.

In the above-described first embodiment, the female thread member 38 is used as the connection member, and the bolt 98 is used as the to-be-connected member; however, as illustrated in FIG. 9, a male thread member 80 may be used as the connection member, and a nut 82 may be used as the to-be-connected member. In FIG. 9, the same components as in the above-described first embodiment are labeled with the same symbols. The male thread member 80 is composed of a ductile material. The male thread member 80 has a head 80a having the same shape as the head 38a, a foot 80b provided at the center of the back surface of the head 80a, and a male thread section 80c provided at the leading end of the foot 80b. The head 80a is stored in the first storage section 36a of the storage hole 36. The foot 80b is inserted in the second storage section 36b and the through-hole 97 of the installation plate 96. The male thread section 80c is screwed into the nut 82. The nut 82 is designed to hook to the step section 97a of the through-hole 97. Since the lower surface of the head 80a engages with the step section 36c of the storage hole 36, the male thread member 80 does not fall from the storage hole 36. When the male thread member 80 is attempted to be axially rotated, the head 80a comes into contact with the side walls of the first storage section 36a to undergo restricted axial rotation. Thus, the nut 82 can be screwed into the male thread section 80c of the male thread member 80. When the nut 82 is screwed into the male thread section 80c of the male thread member 80, the male thread member 80 is set in a state of being pulled toward the installation plate 96 with the head 80a engaging with the step section 36c of the storage hole 36. When the configuration of FIG. 9 is adopted, the same effects as in the above-described first embodiment are obtained. Also, in the second embodiment described below, a male thread member may be used as the connection member instead of the female thread member 538, and a nut may be used as the to-be-connected member instead of the bolt 98.

In the above-described first embodiment, a hole may be provided which penetrates the wafer placement table 10 from the lower surface of the cooling base 30 to the wafer placement surface 22a. As such a hole, a gas supply hole for supplying a thermally conductive gas (for instance, He gas) to the back surface of the wafer W, and a lift pin hole for inserting a lift pin to lift or lower the wafer W with respect to the wafer placement surface 22a may be mentioned. The thermally conductive gas is supplied to the space formed by the wafer W and a large number of small protrusions, not illustrated, (which support the wafer W) provided on the wafer placement surface 22a. For instance, when the wafer W is supported by three lift pins, lift pin holes are provided at three sites. Seal rings (for instance, O-rings) made of resin or metal are disposed at positions between the lower surface of the cooling base 30 and the upper surface of the installation plate 96, the positions being opposed to those holes. Since the central area of the wafer placement table 10 is fixed by the bolts 98, these seal rings are maintained in a firmly crushed state. Thus, these seal rings can secure the sealing property sufficiently. This point also applies to the second embodiment described below.

In the above-described first embodiment, the cooling base 30 is produced with MMC; however, the cooling base 30 may be produced with a brittle material (for instance, alumina material) other than the MMC. This point also applies to cooling base 530 in the second embodiment described below.

In the above-described first embodiment, the wafer attracting electrode 26 is incorporated in the central section 22 of the alumina base 20; however, instead of or in addition to this, an RF electrode for plasma generation may be incorporated, or a heater electrode (resistance heating element) may be incorporated. In addition, a focus ring (FR) attracting electrode may be incorporated, or an RF electrode or a heater electrode may be incorporated in the outer circumferential section 24 of the alumina base 20. This point also applies to the second embodiment described below.

In the above-described first embodiment, the alumina sintered body 120 of FIG. 6A is produced by hot-press firing a molded body of alumina powder, and the molded body may be produced by laminating multiple tape molded bodies, or produced by a mold cast method, or produced by compacting alumina powder. This point also applies to the second embodiment described below.

In the above-described first embodiment, the alumina base 20 and the cooling base 30 are bonded by the metal bonding layer 40; however, a resin bonding layer may be used instead of the metal bonding layer 40. This point also applies to the second embodiment described below.

In the above-described first embodiment, the gap between the female thread member 38 and the first storage section 36a of the storage hole 36 may be filled with a filling material. In this manner, thermal conduction becomes favorable as compared to when the gap is void. Therefore, the thermal uniformity of the wafer W improves. As the filling material, in addition to an adhesive resin and a non-adhesive resin, for instance, a material obtained by adding thermally conductive powder (such as metal powder) to these resins may be mentioned. The female thread member 38 is preferably provided with a through-hole (a through-hole from the inner space of the cylindrical section 38b to the top surface of the head 38a) that penetrates the female thread member 38 vertically. In this manner, at the stage of FIG. 6F, a fluid filling material can be easily injected through the through-hole into the gap between the female thread member 38 and the first storage section 36a of the storage hole 36.

Second Embodiment

Figure 10:
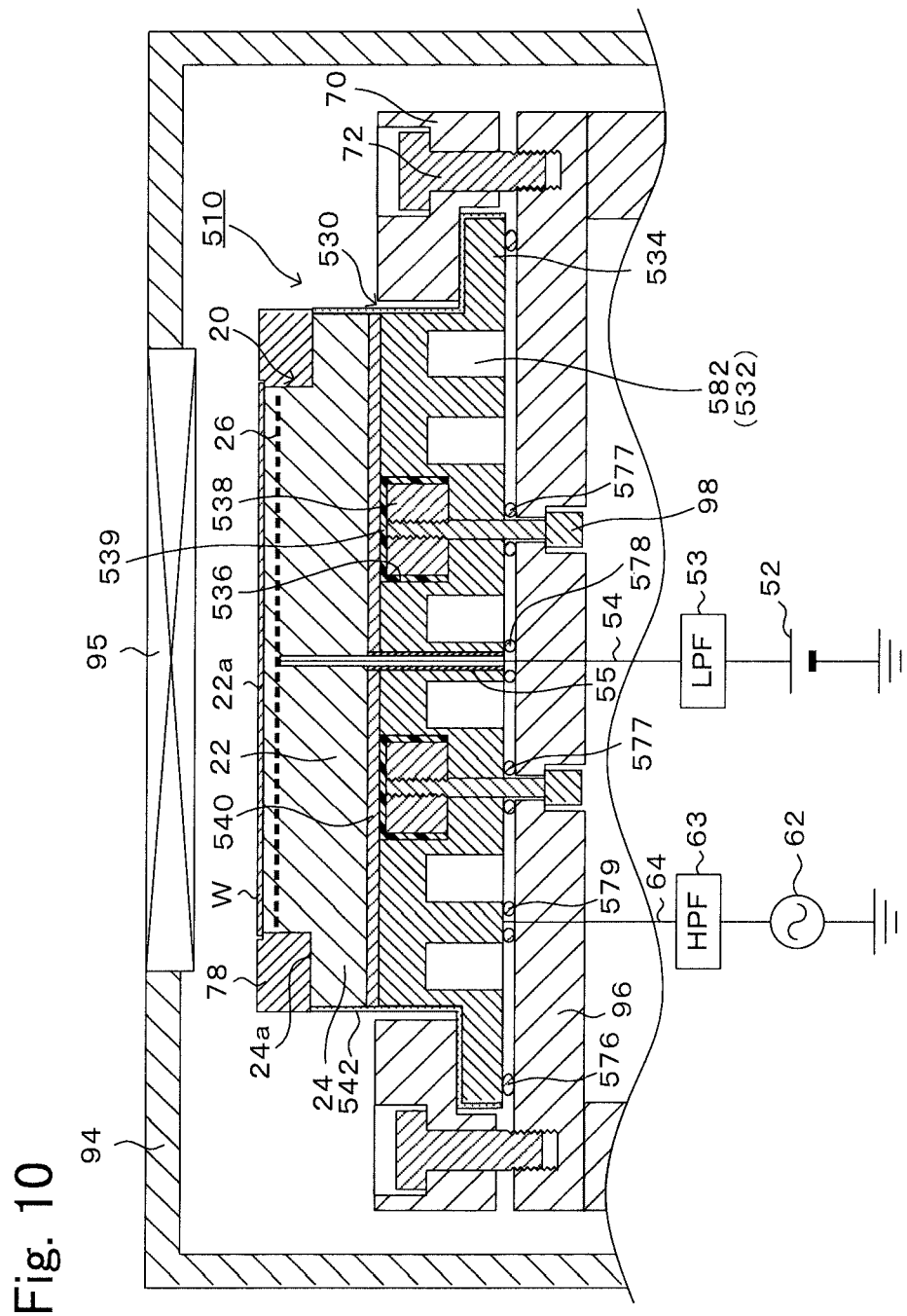
FIG. 10 is a vertical cross-sectional view of a wafer placement table 510 installed in the chamber 94.
Figure 11:
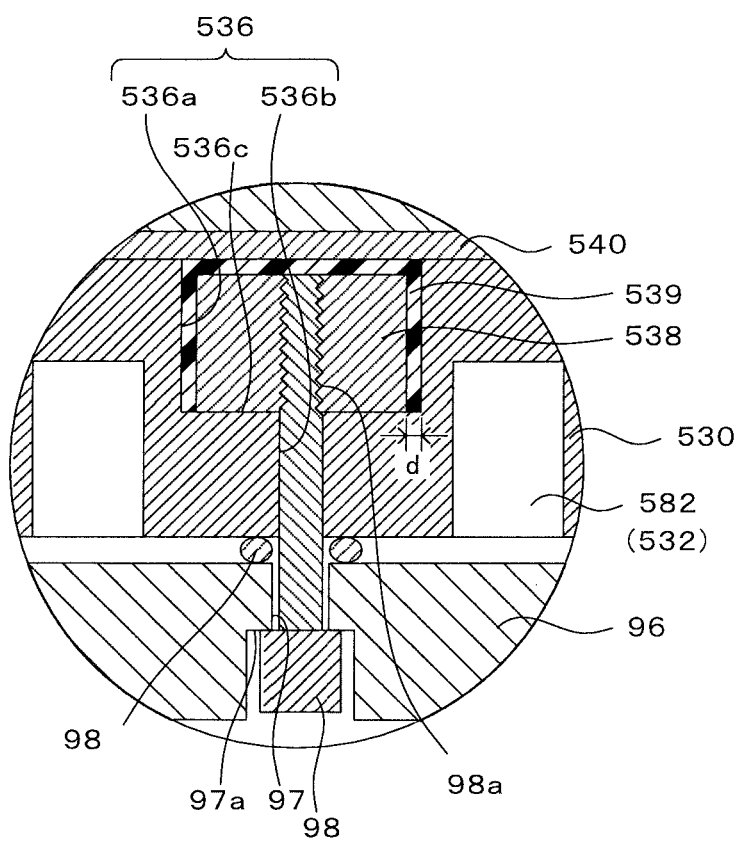
FIG. 11 is an enlarged cross-sectional view illustrating the vicinity of a storage hole 536 and a female thread member 538.

FIG. 10 is a vertical cross-sectional view (cross-sectional view of a wafer placement table 510 cut along a plane including the central axis thereof) of a wafer placement table 510 installed in the chamber 94, and FIG. 11 is an enlarged cross-sectional view illustrating the vicinity of a storage hole 536 and a female thread member 538.

The wafer placement table 510 is also used for performing CVD and etching on the wafer W utilizing plasma, and is fixed to the installation plate 96 provided inside the chamber 94 for semiconductor process. Since the chamber 94 has been explained in the first embodiment, the same components are labeled with the same symbols, and a description thereof is omitted. The wafer placement table 510 includes the alumina base 20, a cooling base 530, and a metal bonding layer 540.

Since the alumina base 20 has been explained in the first embodiment, the same components are labeled with the same symbols, and a description thereof is omitted.

The cooling base 530 is a disc member, and composed of the same material as for the cooling base 30. Herein, the cooling base 530 is assumed to be a disc member made of MMC. The cooling base 530 has a refrigerant flow path groove 582. The refrigerant flow path groove 582 is formed from one end to the other end in a one-stroke pattern, and is provided in the cooling base 530 so as to be opened in the lower surface of the cooling base 530. In the refrigerant flow path groove 582, the opening thereof is closed by the upper surface of the installation plate 96 of the chamber 94, thereby forming a refrigerant flow path 532. Thus, the refrigerant flow path groove 582 constitutes the side walls and the ceiling surface of the refrigerant flow path 532. As in the refrigerant flow path 32 of the above-described first embodiment, the refrigerant flow path 532 is also connected to a refrigerant supply path and a refrigerant discharge path which are not illustrated, and the refrigerant discharged through the refrigerant discharge path undergoes temperature control, then is returned to the refrigerant supply path again. The thickness of the upper side of the cooling base 530 above the refrigerant flow path groove 582 is preferably 5 mm or less, more preferably 3 mm or less. The corners (the corners where the side walls and the ceiling surface intersect) of the upper side of the refrigerant flow path groove 582 are preferably R faces, and the radius of curvature of the R face is preferably 0.5 to 2 mm, for instance. The cooling base 530 is coupled to the RF power supply 62 via the power feed terminal 64. A HPF 63 is disposed between the cooling base 530 and the RF power supply 62. The cooling base 530 has a flange 534 used to clamp to the installation plate 96.

The cooling base 530 is provided with a plurality of storage holes 536, and a female thread member 538 (connection member) is stored in each storage hole 536. As in the storage holes 36 of the first embodiment, the plurality of storage holes 536 are plurally provided at regular intervals along a concentric circle of the cooling base 530. As illustrated in FIG. 11, each storage hole 536 includes a first storage section 536a, a second storage section 536b, and a step section 536c. The first storage section 536a is the space provided at an upper portion of the storage hole 536, and is opened in the upper surface of the cooling base 530. The opening surface (the upper surface) of the first storage section 536a is covered by the metal bonding layer 540. The second storage section 536b is a passage which is provided to be thinner than the first storage section 536a from the first storage section 536a to the lower surface of the cooling base 530. The step section 536c is a stepped surface provided at a joint between the first storage section 536a and the second storage section 536b. The female thread member 538 is stored in the first storage section 536a. The female thread member 538 is a cuboid-shaped (rectangular in a plan view) nut having a thread hole (female thread) in the center. The first storage section 536a is also a cuboid-shaped (rectangular in a plan view) space, and stores the female thread member 538 with allowance. The gap between the female thread member 538 and the first storage section 536a is filled with a filling material 539. Specifically, the gap surrounded by the upper face and the side faces of the female thread member 538, the inner peripheral surface of the first storage section 536a, and the metal bonding layer 540 is filled with the filling material 539. As the filling material 539, in addition to an adhesive resin and a non-adhesive resin, for instance, a material obtained by adding thermally conductive powder (such as metal powder) to these resins may be mentioned. The thermal conductivity of the filling material 539 is preferably, $1\times10^{-4}$ W/mm·K or higher, more preferably, $1\times10^{-3}$ W/mm·K or higher, further more preferably, $1\times10^{-2}$ W/mm·K or higher. The thermal conductivity of the filling material 539 can be adjusted, for instance, by the amount of the thermally conductive powder to be added to the resin. A width d of the gap between the female thread member 538 and the first storage section 536a is preferably 0.2 mm or more in consideration of injection of a fluid uncured filling material into the gap. The step section 536c is disposed below the ceiling surface of the refrigerant flow path groove 582. The female thread member 538 engages with the step section 536c of the storage hole 536. When the female thread member 538 is attempted to be axially rotated, it comes into contact with the side walls of the first storage section 536a to undergo restricted axial rotation. In the embodiment, due to the presence of the filling material 539, axial rotation of the female thread member 538 is also restricted by the filling material 539. The female thread member 538 is composed of a ductile material (for instance, Ti, Mo, W).

The metal bonding layer 540 bonds the lower surface of the alumina base 20 and the upper surface of the cooling base 530. Since the metal bonding layer 540 is the same as the metal bonding layer 40 of the first embodiment, a description thereof is omitted.

The outer circumferential section 24 of the alumina base 20, the outer circumference of the metal bonding layer 540 and the side surface of the cooling base 530 are covered with an insulating film 542. As the insulating film 542, for instance, a thermal spray film such as alumina and yttria may be mentioned.

The wafer placement table 510 is mounted on the installation plate 96 provided inside the chamber 94 with a seal ring 576 having a large diameter and seal rings 577 to 579 having a small diameter interposed between wafer placement table 510 and the installation plate 96. The seal rings 576 to 579 are made of metal or resin. The seal ring 576 is disposed slightly inward of the outer edge of the cooling base 530 to prevent the refrigerant from leaking outwardly of the seal ring 576. The seal ring 577 is disposed to surround the periphery of the foot of the bolt 98 to prevent the refrigerant from entering inwardly of the seal ring 577. The seal ring 578 is disposed at the opening edge of the insulated tube 55 to prevent the refrigerant from entering inwardly of the seal ring 578. The seal ring 579 is disposed to surround the periphery of the power feed terminal 64 to prevent the refrigerant from entering inwardly of the seal ring 579.

The flange 534 provided at the outer circumference of the cooling base 530 is attached to the installation plate 96 using the clamping member 70 and the bolts 72. Since the clamping member 70, the bolts 72 and a clamp method have been explained in the first embodiment, a description thereof is omitted. In addition, the central area of the cooling base 530 is attached to the installation plate 96 using the bolts 98 (to-be-connected members). As illustrated in FIG. 11, the foot of each bolt 98 is provided with the male thread 98a.

The bolt 98 is inserted into the through-hole 97 provided at the position, opposed to the storage hole 536, of the installation plate 96 through the lower surface of the installation plate 96, and the male thread 98*a* is screwed into the female thread member 538 in the first storage section 536*a*. The through-hole 97 has a smaller diameter in the upper section and a larger diameter in the lower section, and has the step section 97*a* between the upper section and the lower section. The head of the bolt 98 hooks to the step section 97*a* of the through-hole 97. Since the female thread member 538 is stored in the first storage section 536*a* in a state of restricted axial rotation, the bolt 98 can be screwed into the female thread member 538. When the bolt 98 is screwed into the female thread member 538, the female thread member 538 in a state of engaging with the step section 536*c* of the storage hole 536 is set in a state of being pulled toward the installation plate 96.

In the embodiment, the central area of the wafer placement table 510 is fixed by the bolts 98, thus, it is possible to prevent the wafer placement table 510 from projecting upward, and to maintain the seal rings 576 to 578 in a firmly crushed state.

Note that refrigerant is supplied and discharged to and from the refrigerant flow path 582 by adopting the same structure as in FIG. 5 explained in the first embodiment.

Figure 12:
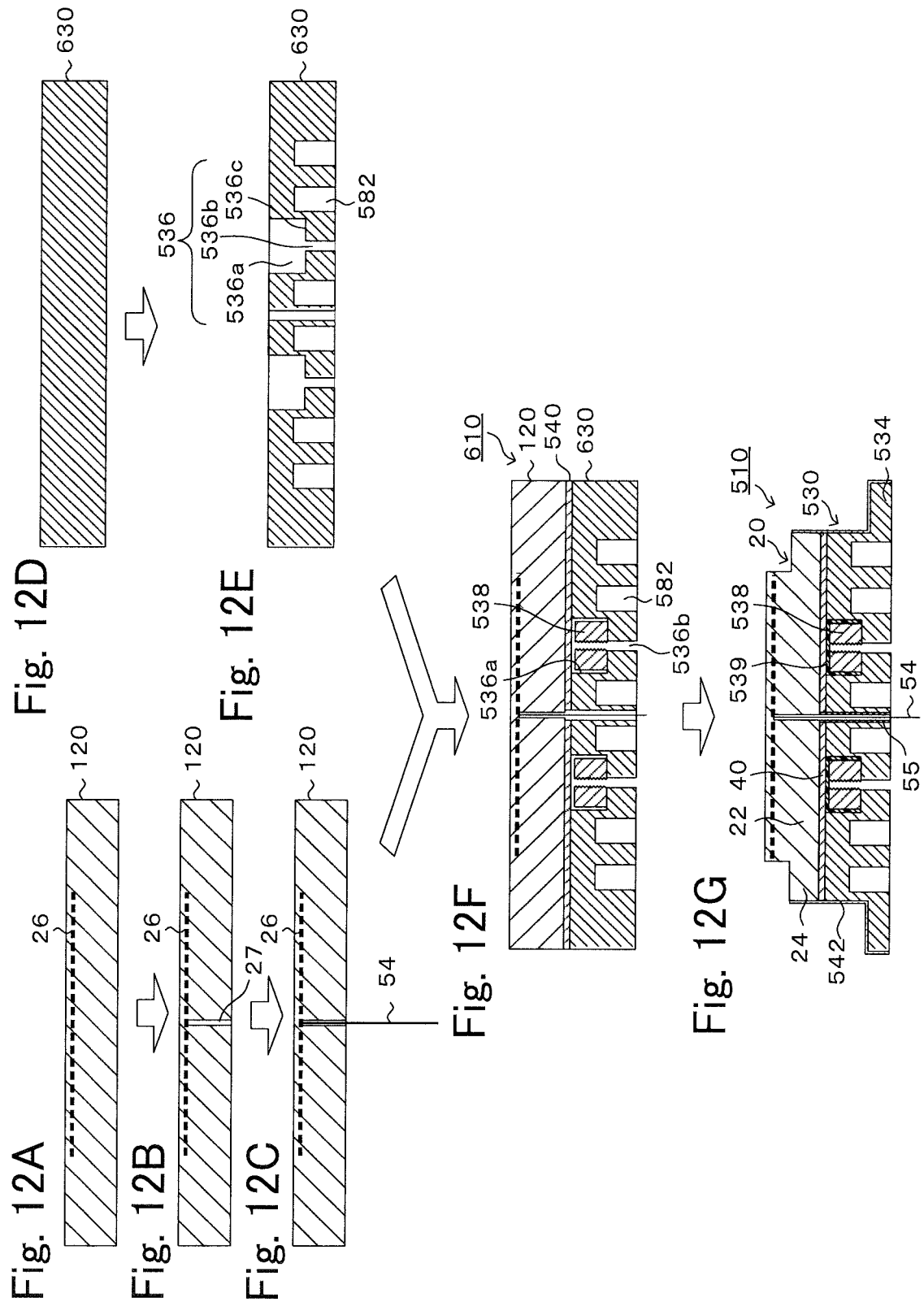
FIGS. 12A to 12G are manufacturing process charts of the wafer placement table 510.

Next, a manufacturing example of the wafer placement table 510 will be described using FIGS. 12A to 12G. FIGS. 12A to 12G are manufacturing process charts of the wafer placement table 510. First, in the same manner as in the first embodiment, the alumina sintered body 120 including the power feed terminal 54 is produced (FIGS. 12A to C).

Concurrently, an MMC disc member 630 is produced (FIG. 12D), and the refrigerant flow path groove 582 is formed in the lower surface of the MMC disc member 630 as well as the storage hole 536 (the first storage section 536*a*, the second storage section 536*b* and the step section 536*c*) which penetrates the MMC disc member 630 vertically, and a through-hole for inserting the power feed terminal 54 are formed (FIG. 12E). In this case, the MMC disc member 630 is preferably made of SiSiCTi or AlSiC. This is because the thermal expansion coefficient of alumina is approximately the same as the thermal expansion coefficients of SiSiCTi and AlSiC.

Next, the female thread member 538 is stored in the first storage section 536*a*, then a metal bonding material is disposed on the upper surface of the MMC disc member 630. The metal bonding material is provided with a through-hole for inserting the power feed terminal 54. Next, the alumina sintered body 120 is placed on the metal bonding material while inserting the power feed terminal 54 of the alumina sintered body 120 into the through-hole of the metal bonding material and the through-hole of the MMC disc member 630. Thus, a laminated body is obtained, in which the MMC disc member 630, the metal bonding material and the alumina sintered body 120 are laminated in that order from the bottom. A bonded body 610 is obtained (FIG. 12F) by pressurizing the laminated body while heating it (TCB). The bonded body 610 is such that the alumina sintered body 120 and the MMC disc member 630 are bonded by the metal bonding layer 540. The female thread member 538 is stored in the first storage section 536*a* of the bonded body 610. Since the metal bonding material and the TCB have been explained in the first embodiment, a description thereof is omitted herein.

Subsequently, a fluid uncured filling material is injected into the gap between the female thread member 538 and the first storage section 536*a* through the second storage section 536*b* and the thread hole of the female thread member 538. The gap is preferably 0.2 mm or more in consideration of easy injection of the uncured filling material. A filling material 539 is formed by curing the injected uncured filling material. Subsequently, the outer circumference of the alumina sintered body 120 is cut to form a step, thus the alumina base 20 including the central section 22 and the outer circumferential section 24 is produced. Also, the outer circumference of the MMC disc member 630 is cut to form a step, thus the cooling base 530 including the flange 534 is produced. In addition, the insulated tube 55 is disposed in the insertion hole of the power feed terminal 54. Furthermore, the insulating film 542 is formed by applying thermal spraying using alumina powder to the side surface of the outer circumferential section 24 of the alumina base 20, the periphery of the metal bonding layer 540 and the side surface of the cooling base 530 (FIG. 12G). Consequently, the wafer placement table 510 is obtained.

Since an example of use of the wafer placement table 510 is the same as the example of use of the wafer placement table 10 of the above-described first embodiment, a description thereof is omitted.

In the wafer placement table 510 described above, each female thread member 538 is stored in a storage hole 536, opened in the lower surface of the cooling base 530, in a state of restricted axial rotation and in a state of engaging with the step section 536*c* (engagement section) of the storage hole 536 so as not to fall from the storage hole 536. Axial rotation of the female thread member 538 is restricted, thus the male thread 98*a* of the bolt 98 inserted from the lower surface side of the cooling base 530 can be screwed into the female thread member 538. In addition, even when the female thread member 538 in a state of engaging with the step section 536*c* of the storage hole 536 is pulled toward the installation plate 96 by the bolt 98 inserted in the installation plate 96, the female thread member 538 is unlikely to break because it has ductility. Consequently, it is possible to tighten the wafer placement table 510 including the brittle cooling base 530 to the installation plate 96 without a problem.

The cooling base 530 is composed of the MMC. Because the MMC is a brittle material, application of the present invention has high significance.

Furthermore, the storage hole 536 includes the step section 536*c* as an engagement section, and the bottom surface of the female thread member 538 functions as a to-be-engaged section. Thus, the engagement section and the to-be-engaged section can be produced relatively easily.

Furthermore, when the female thread member 538 is attempted to be axially rotated, it comes into contact with the side walls of the first storage section 536*a* of the storage hole 536 to undergo restricted axial rotation. Thus, axial rotation of the female thread member 538 can be restricted by a relatively simple configuration. In addition, axial rotation of the female thread member 538 is also restricted by the filling material 539.

Furthermore, the first storage section 536*a* is opened in the upper surface of the cooling base 530, and the opening surface is covered with the metal bonding layer 540. Thus, the first storage section 536*a* can be produced relatively easily as compared to the first storage section 36*a* which is incorporated in the inside of the cooling base 30 as in the first embodiment. In this structure, the refrigerant flow path 532 (the refrigerant flow path groove 582) needs to be provided skirting the storage hole 536, thus the thermal uniformity is likely to reduce in the vicinity immediately above the storage hole 536 of the wafer W. In order to prevent the reduction in the thermal uniformity, the gap between the female thread member 538 and the first storage section 536a of the storage hole 536 is filled with the filling material 539. Consequently, the thermal conduction around the storage hole 536 becomes favorable, thus reduction in the thermal uniformity can be prevented.

It is a matter of course that the present invention is not limited to the above-described embodiment and can be implemented in various forms insofar as falling within the technical scope of the present invention.

Figure 13:
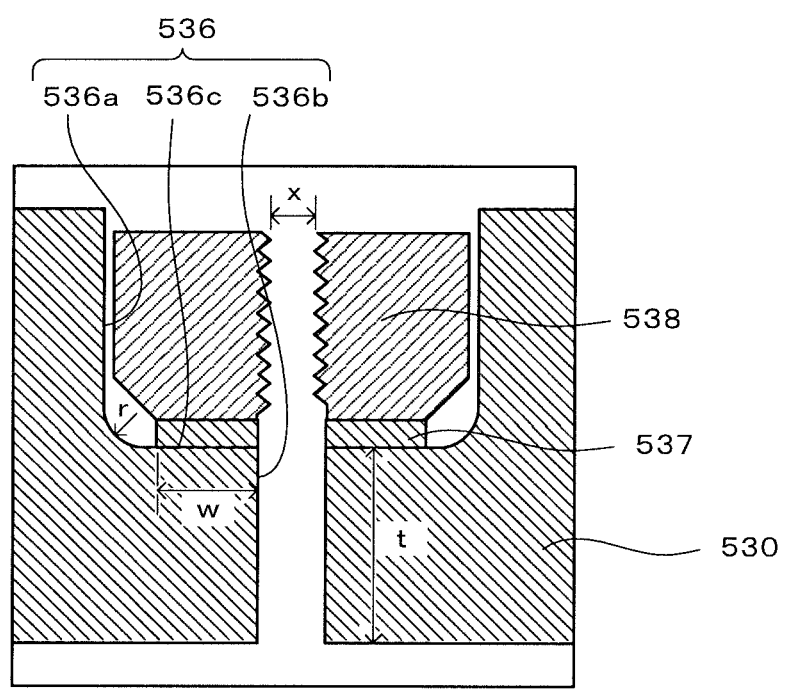
FIG. 13 is a cross-sectional view for dimensional illustration of the storage hole 536 and the female thread member 538.

In the above-described second embodiment, as illustrated in FIG. 13, the female thread member 538 may engage with the step section 536c of the storage hole 536 with a stress buffering member 537 interposed between the female thread member 538 and the step section 536c, the stress buffering member 537 having a lower Young's modulus than the female thread member 538. For instance, Ti alloy may serve as the female thread member 538, and pure Al may serve as the stress buffering member 537. In this manner, even when the female thread member 538 is pulled toward the installation plate 96 by the bolts 98 provided in the installation plate 96, the stress tends to be dispersed because the stress buffering member 537 is interposed between the female thread member 538 and the step section 536c. First, in order to reduce the stress in the first storage section 536a, width w of the annular region where the step section 536c and the female thread member 538 are in indirect contact with each other is preferably 3 mm or greater, and more preferably 5 mm or greater. Second, the inner diameter x of the thread hole of the female thread member 538 is preferably 10 mm or less, and more preferably 7 mm or less. Third, when corners between the bottom face and the side faces of the first storage section 536a are chamfered to R faces (rounded faces), the radius r of curvature is preferably 0.3 mm or greater, and more preferably 0.5 mm or greater. The first to third conditions indicate the order of stress reduction effect, and the first condition has the highest stress reduction effect. The corners between the bottom face and the side faces of the female thread member 538 are preferably R faces or C faces. The thickness t from the step section 536c to the lower surface of the cooling base 530 is preferably 3 mm or greater and 10 mm or less. These numerical value ranges apply to the case where the stress buffering member 537 is not provided, and to the first embodiment.

In the above-described second embodiment, the lower surface of the cooling base 530 is provided with the refrigerant flow path groove 582, the installation plate 96 (lower base) is disposed below the cooling base 530, and the seal rings which liquid-tightly seal the refrigerant flow path groove 582 are disposed between the lower surface of the cooling base 530 and the installation plate 96. However, the present invention is not particularly limited to this. For instance, a refrigerant flow path groove may be provided in the upper surface of the installation plate instead of the lower surface of the cooling base, and the seal rings which liquid-tightly seal the refrigerant flow path groove may be disposed between the lower surface of the cooling base and the installation plate. The cooling base is brittle MMC or alumina, and the cooling base is provided with the first storage section.

Figure 14A:
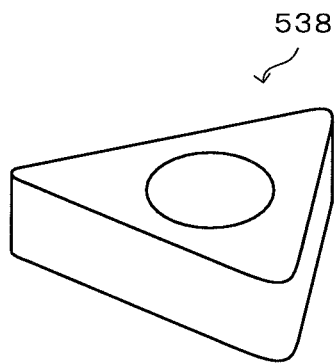
FIGS. 14A and 14B show explanatory diagrams when a triangular prism-shaped nut is used as the female thread member 538.
Figure 14B:
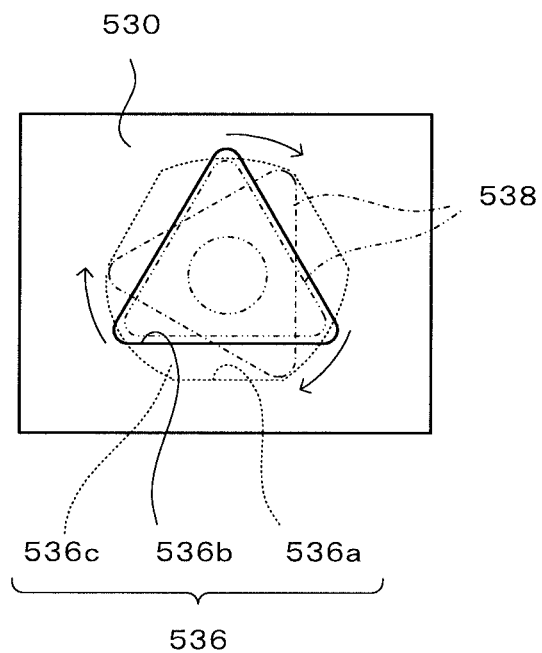

In the above-described second embodiment, as illustrated in FIG. 14A, a triangular prism-shaped (triangular in a plan view) nut having a thread hole in the center may be used as the female thread member 538. In this case, the storage hole 536 may be formed as in FIG. 14B. FIG. 14B is a partial enlarged view of the vicinity of the storage hole 536, as seen from below the cooling base 530. In FIG. 14B, the second storage section 536b is a hole through which the female thread member 538 can be passed, the hole having a triangular plan view, and the first storage section 536a is a space (a composite figure of a triangle and a circle in a plan view) which allows the female thread member 538 to be axially rotated only by a predetermined angle. A dashed-two dotted line indicates a state immediately after the female thread member 538 is inserted in the second storage section 536b and stored in the first storage section 536a, and a dashed-dotted line indicates the manner in which the female thread member 538 stored in the first storage section 536a is axially rotated in the arrow direction only by a predetermined angle. At this point, the step section 536c is the section which is inside the outer edge of the first storage section 536a and outside the opening edge of the second storage section 536b, and this section engages with the female thread member 538. With this structure, after the alumina base 20 and the cooling base 530 are bonded, the female thread member 538 can be stored in the first storage section 536a. For instance, first, the alumina base 20 and the cooling base 530 are bonded by the metal bonding layer 540 without storing the female thread member 538 in the first storage section 536a. Subsequently, a fluid uncured filling material is injected into the first storage section 536a with the lower surface of the cooling base 30 facing upward. Subsequently, the female thread member 538 is stored in the first storage section 536a from the second storage section 536b, and the female thread member 538 is axially rotated only by a predetermined angle. Consequently, the uncured filling material is evenly filled between the female thread member 538 and the first storage section 536a. Subsequently, the uncured filling material is cured to become the filling material 539. Note that this structure can be applied to not only a triangular prism-shaped nut, but also a polygonal prism-shaped (quadrilateral prism-shaped or hexagonal prism-shaped) nut.

Instead of the female thread member 538 of the above-described second embodiment, the female thread member 38 (FIG. 3, FIG. 7 or FIG. 8) of the first embodiment may be used. In that case, the female thread member 38 is preferably provided with a through-hole (from the inner space of the cylindrical section 38b to the top surface of the head 38a) that penetrates the female thread member 38 vertically. This is because when the through-hole is utilized, a fluid uncured filling material is easily filled in the gap between the head 38a and the first storage section of the storage hole.

Figure 15:
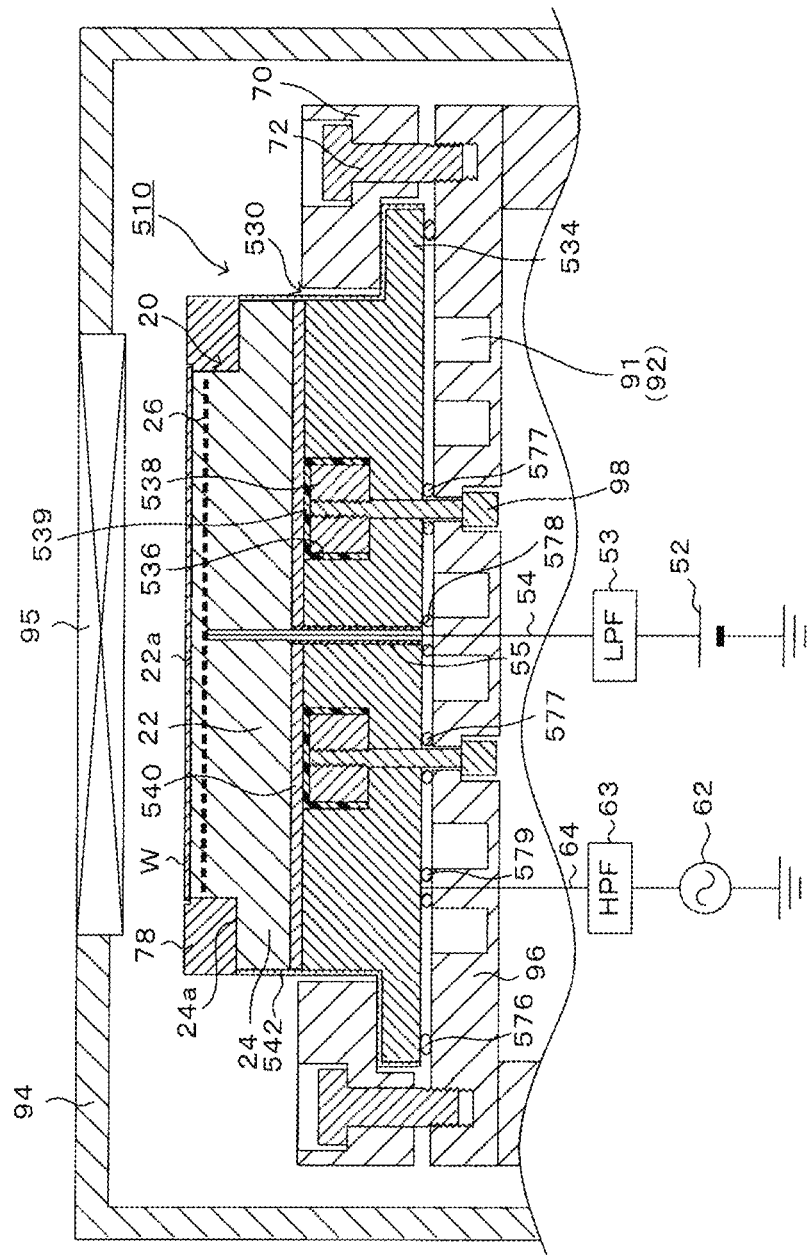
FIG. 15 is a vertical cross-sectional view of the wafer placement table 510 of another example.

In the above-described second embodiment, as illustrated in FIG. 15, instead of providing the refrigerant flow path groove 582 (refrigerant flow path 532) in the cooling base 530, the upper surface of the installation plate 96 may be provided with the refrigerant flow path groove 91, and a refrigerant flow path 92 may be formed by closing the upper opening of the refrigerant flow path groove 91 with the cooling base 530. In FIG. 15, the same components as in the above-described second embodiment are labeled with the same symbols. Note that also in the first embodiment, instead of providing the refrigerant flow path 32 in the cooling base 30, the upper surface of the installation plate 96 may be provided with a refrigerant flow path groove as in FIG. 15, and a refrigerant flow path may be formed by closing the upper opening of the refrigerant flow path groove with the cooling base 30.

The present application claims priority from Japanese Patent Application No. 2021-185369, filed on Nov. 15, 2021, and Japanese Patent Application No. 2022-108438, filed on Jul. 5, 2022, the entire contents of which are incorporated herein by reference.

What is claimed is:

1. A wafer placement table comprising:
an alumina base that has a wafer placement surface on its upper surface, and incorporates an electrode;
a brittle cooling base bonded to a lower surface of the alumina base; and
a ductile connection member stored in a storage hole, opened in a lower surface of the cooling base, in a state of restricted axial rotation and in a state of engaging with an engagement section of the storage hole, the ductile connection member having a male thread section or a female thread section; and
wherein the engagement section is a step section or an inclined section provided in an inner circumferential surface of the storage hole, and
the connection member has a to-be-engaged section which engages with the engagement section to prevent the connection member from falling from the storage hole.

2. The wafer placement table according to claim 1,
wherein the connection member is a member having the female thread section, and being screwable to a male thread of a bolt inserted from a lower surface side of the cooling base.

3. The wafer placement table according to claim 1,
wherein the cooling base is composed of a composite material of metal and ceramic or an alumina material.

4. The wafer placement table according to claim 1,
wherein when being attempted to be axially rotated, the connection member comes into contact with a wall of the storage hole to undergo restricted axial rotation.

5. The wafer placement table according to claim 1,
wherein the cooling base has a refrigerant flow path internally, and
the storage hole is provided in a region of the cooling base, the region being lower than a bottom surface of the refrigerant flow path.

6. The wafer placement table according to claim 1,
wherein the connection member is not bonded to the cooling base in the storage hole, and is stored in a free state.

7. The wafer placement table according to claim 1,
wherein the connection member engages with the engagement section with a stress buffering member interposed between the connection member and the engagement section, the stress buffering member having a Young's modulus lower than a Young's modulus of the connection member.

8. The wafer placement table according to claim 1,
wherein a gap between the connection member and the storage hole is filled with a filling material.

9. The wafer placement table according to claim 1,
wherein the storage hole includes a first storage section that stores the connection member, and a second storage section provided from the first storage section to the lower surface of the cooling base, and
the engagement section is a stepped surface provided at a joint between the first storage section and the second storage section.

10. The wafer placement table according to claim 9,
wherein the first storage section is opened in an upper surface of the cooling base, and an opening surface is covered by a bonding layer that bonds the alumina base and the cooling base.

11. The wafer placement table according to claim 9,
wherein a width of an annular region in which the stepped surface is in direct or indirect contact with the connection member is 3 mm or more.

* * * * *